United States Patent
Hansen et al.

(10) Patent No.: US 9,329,473 B2
(45) Date of Patent: May 3, 2016

(54) METHOD AND DEVICE FOR ACTIVE WEDGE ERROR COMPENSATION BETWEEN TWO OBJECTS THAT CAN BE POSITIONED SUBSTANTIALLY TO PARALLEL TO EACH OTHER

(75) Inventors: Sven Hansen, Garching (DE); Matthias Conradi, Garching (DE); Georg Fink, Munich (DE)

(73) Assignee: SUSS MICROTEC LITHOGRAPHY GMBH, Garching (DE)

( * ) Notice: Subject to any disclaimer, the term of this patent is extended or adjusted under 35 U.S.C. 154(b) by 210 days.

(21) Appl. No.: 13/261,204
(22) PCT Filed: Feb. 14, 2011
(86) PCT No.: PCT/EP2011/052141
§ 371 (c)(1), (2), (4) Date: Mar. 6, 2012
(87) PCT Pub. No.: WO2011/098604
PCT Pub. Date: Aug. 18, 2011

(65) Prior Publication Data
US 2012/0299208 A1  Nov. 29, 2012

(30) Foreign Application Priority Data
Feb. 15, 2010  (DE) .......................... 10 2010 007 970

(51) Int. Cl.
*B29C 43/58* (2006.01)
*G03F 7/00* (2006.01)
(Continued)

(52) U.S. Cl.
CPC .............. *G03F 7/0002* (2013.01); *B29C 43/58* (2013.01); *B82Y 10/00* (2013.01); *B82Y 40/00* (2013.01); *B29C 2043/025* (2013.01); *B29C 2043/5858* (2013.01)

(58) Field of Classification Search
CPC .................. B29C 2043/025; B29C 2043/5858; B29C 43/021; B29C 2043/023; B29C 43/04; B29C 59/02; B29C 59/022; B29C 2059/023; B29C 2045/025; B29C 2045/5858; B82Y 10/00; B82Y 40/00; H01L 21/68; H01L 21/67259; F16M 11/18; F16M 11/046; F16C 29/02; F16C 29/025
USPC .......................................... 425/135, 149, 150
See application file for complete search history.

(56) References Cited

U.S. PATENT DOCUMENTS 4,136,459 A    1/1979  Suss ............................. 33/180 R
4,470,787 A *  9/1984  Gram ...................... B30B 1/323
                                                    425/183

(Continued)

FOREIGN PATENT DOCUMENTS

DE       0154 146      2/1982   ............. H01L 21/68
DE      298 327 A5     2/1993   ............... G12B 1/00

(Continued)

OTHER PUBLICATIONS

Office Action of Oct. 25, 2013 in corresponding Chinese Patent Application No. 201180004313.9.

(Continued)

*Primary Examiner* — Alison L Hindenlang
(74) *Attorney, Agent, or Firm* — Hayes Soloway, P.C.

(57) ABSTRACT

The invention relates to a method and device for expanding the travel or control displacement of linear actuators that is available during an imprinting or embossing stroke. The wedge error compensating head (2) comprises a movable part (4), a stationary part (3) and at least three linear actuators (8). Each linear actuator (8) is connected to one of the parts (3, 4) at one end and to the other of the two parts (4, 3) by wedges (9) at the other end. By means of the wedges (9), it is possible to coarsely or roughly compensate for wedge errors and possible tolerances of individual subcomponents of the system. The linear actuators (8) are only used for fine or precision compensation for the wedge error. In this way, sufficient control displacement is available for the imprinting stroke with the linear actuators.

14 Claims, 3 Drawing Sheets

(51) Int. Cl.
*B82Y 10/00* (2011.01)
*B82Y 40/00* (2011.01)
*B29C 43/02* (2006.01)

(56) References Cited

U.S. PATENT DOCUMENTS

| | | | | |
|---|---|---|---|---|
| 5,002,479 | A * | 3/1991 | Brown | B29C 33/20 425/182 |
| 6,214,692 | B1 | 4/2001 | Thallner | 438/401 |
| 6,471,501 | B1 * | 10/2002 | Shinma | B29C 43/36 425/127 |
| 6,873,087 | B1 | 3/2005 | Choi et al. | 310/323.17 |
| 2003/0047535 | A1 | 3/2003 | Schueller et al. | 216/41 |
| 2004/0234361 | A1 * | 11/2004 | Nakamura et al. | 414/217 |
| 2005/0275251 | A1 | 12/2005 | Choi | 297/40 |
| 2006/0001857 | A1 | 1/2006 | Cherala et al. | 355/72 |
| 2006/0193938 | A1 * | 8/2006 | Iimura et al. | 425/385 |
| 2008/0213418 | A1 * | 9/2008 | Tan et al. | 425/112 |
| 2009/0251699 | A1 | 10/2009 | George | 356/401 |

FOREIGN PATENT DOCUMENTS

| | | | |
|---|---|---|---|
| EP | 2299472 A1 | 3/2011 | H01L 21/00 |
| KR | 10 2005 0081921 | 8/2005 | H01L 21/027 |

OTHER PUBLICATIONS

Office Action of Nov. 6, 2013 in corresponding Singapore Patent Application No. 201205915-0.

English translation of Second Office Action for Chinese Patent Application No. 201180004313.9 dated Jun. 11, 2014 (7 Pages).

* cited by examiner

METHOD AND DEVICE FOR ACTIVE WEDGE ERROR COMPENSATION BETWEEN TWO OBJECTS THAT CAN BE POSITIONED SUBSTANTIALLY TO PARALLEL TO EACH OTHER

This patent Application is a U.S. National Phase Patent Application from PCT Application No. PCT/EP2011/052141, filed Feb. 14, 2011 and claiming priority from German Patent Application No. 102010007970.7, filed Feb. 15, 2010.

FIELD OF THE INVENTION

The invention relates to a method and a device for wedge error compensation, and in particular to a method and a device in which the control displacement available for the wedge error compensation can be increased.

BACKGROUND TO THE INVENTION

When producing micro-electronic, micro-optical and micro-mechanical components, structures are transferred to a substrate by means of a mask or a punch by using embossing or imprint lithography. If the angle between the plane of the mask and the plane of the substrate changes, the structures are no longer uniformly imprinted in the substrate. This situation is referred to as wedge error. Therefore, wedge error compensation substantially determines the quality of the imprint.

In principle, there are two kinds of wedge error compensation, namely passive wedge error compensation and active wedge error compensation.

In passive wedge error compensation, the wedge error compensating head moves with or without the substrate against the mask or punch. It contacts the mask either with its entire surface or via spacers. After the movable part of the wedge error compensating head or the substrate has contacted the mask, the relative position of the mask and the movable part of the wedge error compensating head is locked by applying brakes. The angle formed between the plane of the mask and the plane of the substrate or the surface of the movable part of the wedge error compensating head is maintained for at least one process cycle.

A problem related with passive wedge error compensation is that the brakes can hold a relatively small force of about 100 N only. For SUSS MicroTec Microlens Imprint Lithography (SMILE™), Substrate Conformal Imprint Lithography (SCIL) and Nanoimprint Lithography (NIL) processes this force is too small.

In order to overcome the disadvantages of passive wedge error compensation, active wedge error compensation is used. Active wedge error compensation first takes place in a manner equal to that of passive wedge error compensation. Instead of locking the relative position of the mask relative to the movable part of the wedge error compensating head or the substrate, measuring probes are used for referencing this relative position. Then, the movable part of the wedge error compensating head is placed onto three linear actuators arranged in the reference plane, e.g. at azimuthal intervals of 120°. By means of the measuring probes and by applying the linear actuators, it is possible to actively compensate for the wedge error. If piezo elements are used for the linear actuators, typically displacements of up to 80 μm can be compensated for. In this connection, the control displacement is the maximally available distance by which a linear actuator can move the movable part relative to the stationary part of the wedge error compensating head.

A problem related with this active wedge error compensation is the small control displacement, in particular if, e.g., piezo elements are used for the linear actuators. In a compact system, the available constructional space is limited. Therefore, the piezo elements cannot be elongated in order to increase the control displacement. The control displacements available for the actual imprinting stroke are reduced further if the maximally available control displacements are already necessary to a large extent for a tolerance compensation for the dimensions of the components used in the system, e.g. the chuck, the adapter frame, the mask holder, the substrate holder, etc. It can even be the case that only a few micrometers are left for the actual imprinting stroke.

In view of the above-mentioned problems of the prior art, it is an object of the present invention to provide a method and a device in which the control displacement available for the wedge error compensation is increased. It is a further object of the invention to be able to use the control displacement of the linear actuators almost completely for the imprinting stroke. These objects are achieved by the features of the claims.

SUMMARY OF THE INVENTION

In achieving these objects, the invention starts out from the basic idea that the tolerances of the components used in the system and of the substrate are previously coarse-compensated for, e.g., by using wedges, so that only a small part, e.g., 10% of the control displacement of the linear actuators is necessary for the remaining fine wedge error compensation. The remaining control displacement of the linear actuators can thus be used almost completely for the imprinting stroke for processing the substrate.

The wedge error compensating head for compensating for the wedge error comprises a stationary part, a movable part and linear actuators. The movable part is connected with the stationary part through the linear actuators. One end of each linear actuator is connected directly with one of the two parts of the wedge error compensating head or abuts against the counter bearing of the respective part of the wedge error compensating head. Between the other end of each linear actuator and the other part of the wedge error compensating head, a coarse compensation is made, e.g., by inserting wedges. Preferably, three linear actuators are used, which are arranged symmetrically in the reference plane, e.g., at azimuthal intervals of 120°. Thus, the movable part of the wedge error compensating head can be positioned as desired relative to the stationary part of the wedge error compensating head.

The wedges allow a coarse compensation for tolerances of the components of the system including the substrate. For example, in case of a non-uniformly thick substrate in which the thickness decreases from one edge to the other edge, the movable part of the wedge error compensating head can be aligned such by means of the wedges that the substrate is almost parallel to a mask for imprinting structures into the substrate. By means of the linear actuators, a fine correction of the parallelism of substrate and mask can then be made, and finally the imprinting stroke for structuring the substrate can be carried out by uniformly applying all linear actuators.

For achieving a compact design of the device, the wedges can be integrated in the movable part or in the stationary part of the wedge error compensating head. The movable part of the wedge error compensating head can be used for receiving the substrate. In this case, the movable part of the wedge error compensating head with the substrate is pressed against a stationary mask in order to imprint structures into the substrate. Alternatively, the mask can be arranged on the movable part of the wedge error compensating head, so that upon application of the linear actuators, the mask is pressed against the stationary substrate to perform the imprinting operation.

The linear actuators preferably comprise piezo elements. The deflection of the linear actuators or the deflection of the wedges takes place individually for each linear actuator or for each wedge, respectively, by means of a controller. The wedges are deflected, i.e. displaced preferably pneumatically.

In accordance with an embodiment, the linear actuators are highly precise and have in particular only small ranges of operation (control displacements also in the nm range).

By means of measuring probes provided on a stationary holder for receiving the mask or the substrate and contacting the surface of the movable part, the position of the movable part of the wedge error compensating head can be measured relative to this holder. Alternatively, other sensors can be used. These sensors measure the position of sensor pins mounted on the movable part of the wedge error compensating head. Preferably, at least three of these measuring probes or sensors are used.

By using brakes, the position of the movable part of the wedge error compensating head can be locked relative to the stationary part of the wedge error compensating head.

Alternatively, the wedges are not aligned actively to compensate for the wedge error. In this case, only after aligning and locking the movable part of the wedge error compensating means, the wedges are moved between the linear actuators and a part of the wedge error compensating head in order to fill the gaps. In this way, too, a coarse compensation for the wedge error is achieved. After releasing the brakes, only a slight control displacement of the linear actuators is necessary for carrying out the fine wedge error compensation.

The wedge error compensation according to the present invention can be described as follows: First, the wedge error, which is caused by tolerances of the components used in the system including the substrate, is coarse-compensated for by positioning the wedges. Then, a possibly still present slight wedge error is fine-compensated for by means of the linear actuators. Therefore, almost the maximum control displacement of the linear actuators is still available in the subsequent imprinting stroke.

In detail, the wedge error compensation according to the present invention can be carried out as follows: First, the wedge error compensating head or its movable part is pressed against a mask arranged in a stationary holder, so that the position of the movable part of the wedge error compensating head can be determined in this position. By applying brakes, the angle between the mask and the surface of the wedge error compensating head or of the substrate on the wedge error compensating head is locked. Subsequently, the wedge error compensating head or the movable part of the wedge error compensating head is moved away from the mask. Then, the wedges are moved between the linear actuators and the movable part of the wedge error compensating head. Subsequently, the brakes are opened. By checking the position of the movable part of the wedge error compensating head by means of the measuring probes or the sensors, the wedges can be accordingly readjusted. However, this readjustment of the wedges can also be omitted. Now, the coarse adjustment of the position of the movable part of the wedge error compensating head is finished. Subsequently, the position of the movable part of the wedge error compensating head is fine-adjusted by means of the linear actuators. Since the control displacement of the linear actuators was not necessary for the coarse compensation for the wedge error and possible tolerances, after the fine compensation for the wedge error, almost the entire control displacement of the linear actuators is still available for the imprinting stroke.

BRIEF DESCRIPTION OF THE DRAWINGS

In the following, the invention will be described in more detail with reference to the drawings in which.

DETAILED DESCRIPTION OF THE INVENTION

Figure 1:
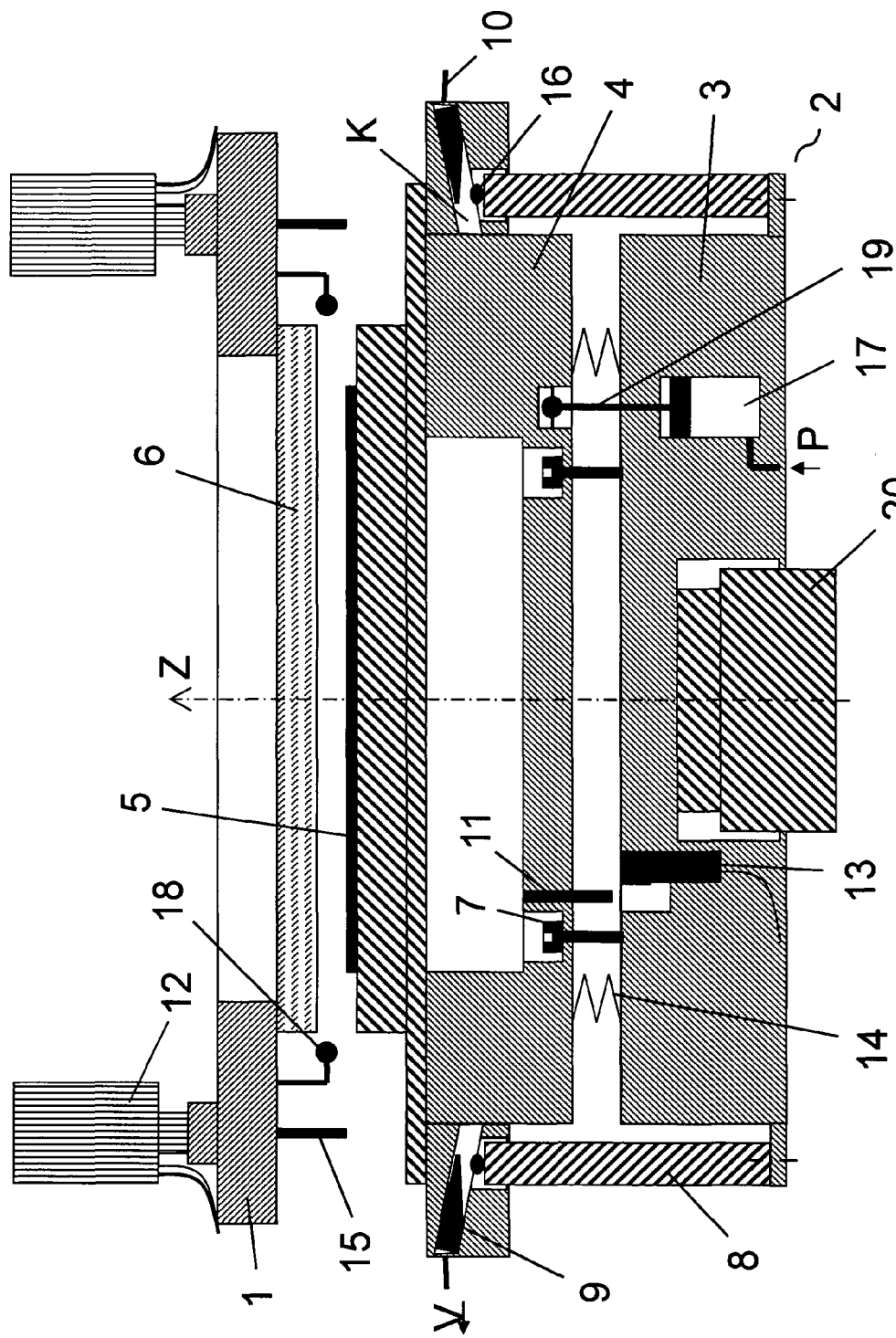
FIG. 1 shows a sectional view of a wedge error compensating device before measurement of the position of the movable part of the wedge error compensating head (reference measurement)

FIG. 1 shows a sectional view of a device for active wedge error compensation. The device is suitable for imprinting structures into a substrate 5. The device comprises the wedge error compensating head 2 according to the invention and a holder 1 to which a mask (or punch) 6 is fixed for imprinting the structures into the substrate 5.

The wedge error compensating head 2 comprises a movable part 4 and a stationary part 3. Pressure springs 14 are provided between the movable part 4 and the stationary part 3. By using a hydraulically or pneumatically operating means 17, the movable part 4 and the non-movable part 3 can be moved towards each other in that a piston 19, which is fixed to the movable part 4, is moved towards the stationary part 3 by a negative pressure in the means 17 located in the stationary part 3. By means of the brakes 7, the movable part 4 can be locked relative to the stationary part 3. The substrate 5 to be treated is applied to the free surface of the wedge error compensating head 2.

The movable part 4 of the wedge error compensating head 2 is moreover connected via linear actuators 8 with the stationary part 3 of the wedge error compensating head 2. On one end, the linear actuators are connected directly with the stationary part of the wedge error compensating head 2. A support element 16 is provided on the other end of the linear actuators 8. Wedges 9 can be moved in channels K provided for this purpose, so that a contact between support element 16 and wedge 9, on the one hand, and wedge 9 and movable part 4, on the other hand, can be achieved. FIG. 1 shows two linear actuators 8. Preferably, the wedge error compensating head 2 comprises three linear actuators 8, which are arranged symmetrically at azimuthal intervals of 120° (as seen in the imprinting direction Z). Moreover, the linear actuators 8 preferably comprise piezo elements. A simultaneous deflection of all actuators 8 causes the imprinting stroke which presses the movable part 4 of the wedge error compensating head 2 with the substrate 5 onto the mask 6.

In addition to the mask 6, also spacers 18 are attached to the holder 1. The spacers 18 can be inserted between mask 6 and substrate 5.

The device according to FIG. 1 moreover comprises measuring probes 15. The measuring probes 15 are connected with measuring heads 12 through bores in the holder 1. The measuring heads 12 detect the movement or position of the measuring probes 15 and provide a corresponding signal to a controller (not shown). By means of its free ends or tips, the measuring probes can contact the surface of the movable part 4 of the wedge error compensating head in order to determine the position of the movable part 4. Preferably, at least three measuring probes 15, which are offset in the azimuth direction relative to the imprinting axis Z by 120° each and comprise corresponding measuring heads 12, are used in order to be able to measure the position of the movable part 4 precisely in the plane.

A sensor 13 is provided in the stationary part 3 of the wedge error compensating head 2 for determining the movement or position of a sensor pin 11 fixed to the movable part 4 of the wedge error compensating head 2. Preferably, at least three pairs of a sensor 13 and a sensor pin 11 are used, which are offset in the azimuth direction relative to the imprinting axis Z by 120° each. The sensors 13 and sensor pins 11 offer a further possibility for measuring the position of the movable part 4 of the wedge error compensating head 2.

The entire wedge error compensating head 2 can be moved via a lifting means 20 in the imprinting direction Z. For example, it is necessary to move the wedge error compensating head 2 by the lifting means 20 far away from the holder 1 in order to change the substrate 5 and/or the mask 6.

Figure 2:
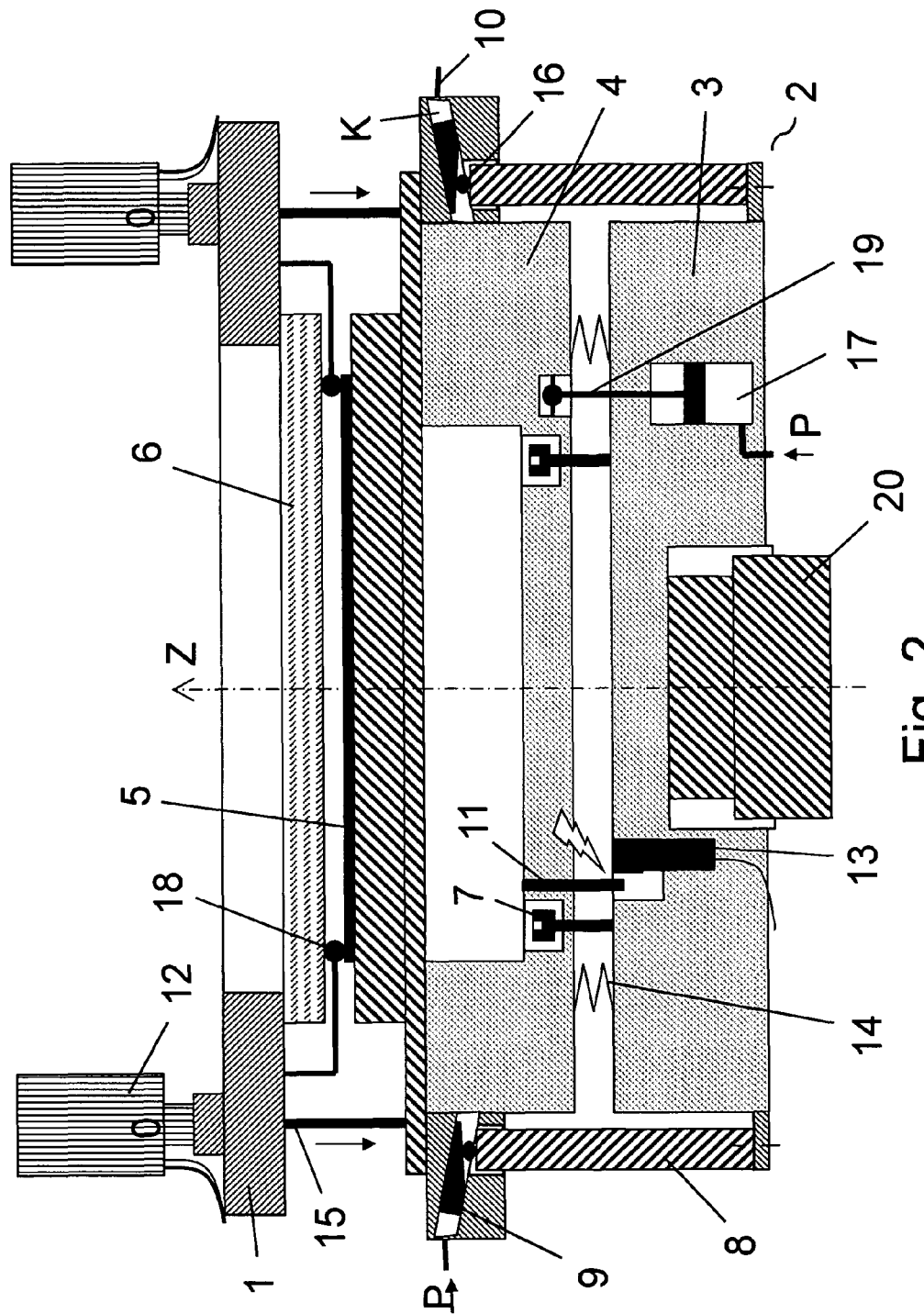
FIG. 2 shows a sectional view of the wedge error compensating device during reference measurement.

FIG. 2 shows a sectional view of the wedge error compensating device while measuring the position of the movable part 4 of the wedge error compensating head 2. For being able to later compensate for a wedge error, first a reference measurement must be carried out. It must be determined in which position of the movable part 4 of the wedge error compensating head 2 the angle between substrate 5 and mask 6 is minimal, i.e. when the two elements are aligned optimally parallel. For this purpose, spacers 18 can be inserted between substrate 5 and mask 6. Then, the movable part 4 is moved so far in the direction of the mask 6 until the spacers 18 contact both the substrate 5 and the mask 6.

By means of the measuring probes 15 or sensors 13, the reference measurement is carried out. Alternatively, the reference measurement can also be carried out without spacers 18 in that the mask 6 and the substrate 5 are brought in direct contact.

FIG. 2 shows that after the reference measurement the wedges 9 are moved so far within the channels K provided for this purpose that the wedges 9 contact both the movable part 4 and the support elements 16. The wedges 9 are moved pneumatically by means of the connections 10 for pressurized air.

Figure 3:
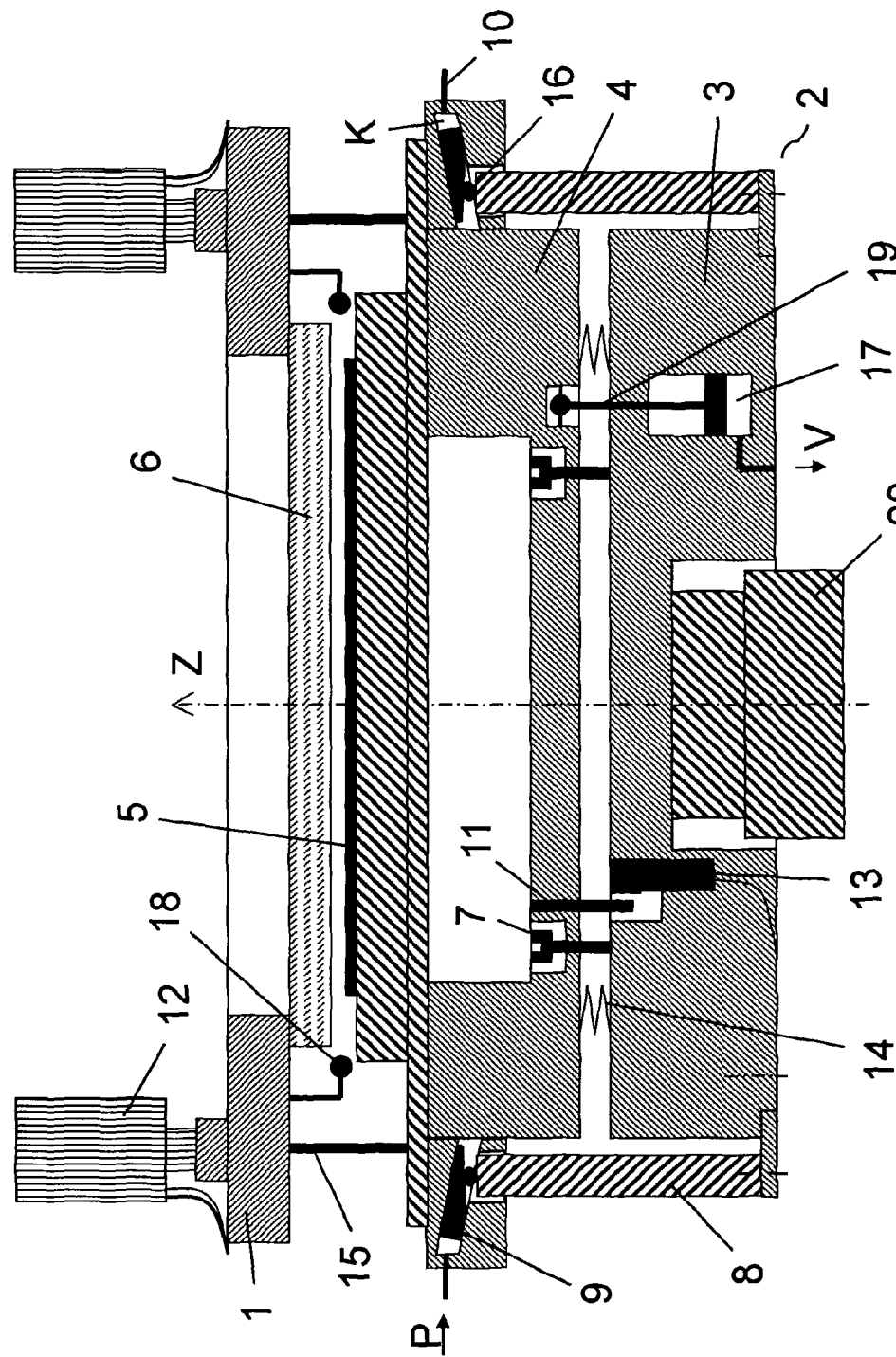
FIG. 3 shows a sectional view of the wedge error compensating device after measurement of and compensation for the wedge error and before the imprinting stroke.

FIG. 3 shows the device according to the invention after removal of the spacers 18. The wedge error and the tolerances of the component used in the system, including the substrate 5, have already been coarse-compensated for by the wedges 9. The wedge error is fine-compensated for by use of the linear actuators 8. Since the coarse compensation has already been carried out, only slight control displacements of the linear actuators 8 are necessary for the fine compensation. For example, only about 10% of the maximally available control displacement of a linear actuator 8 are necessary for the fine compensation. Therefore, about 90% of the maximum control displacement of the linear actuators 8 are still available for the subsequent embossing or imprinting stroke.

In the following, a possible sequence of steps of a wedge error compensation according to the invention is described:

In step 1 it is first checked whether the wedges are in their basic position. If they are not in the basic position, they are brought in the basic position. The basic position is the position in which the wedges 9, as shown in FIG. 1, are in an outer position far away from the linear actuators 8.

In step 2, the wedge error compensating head 2 is moved against a mask 6, so that the substrate 5 or the movable part 4 is aligned parallel to the mask 6.

In step 3, the position of the movable part 4 of the wedge error compensating head 2 is measured. This reference measurement is necessary for being able to realign the movable part 4 of the wedge error compensating head 2 in this exact position before imprinting.

In step 4, the angle between the substrate 5 or the movable part 4 of the wedge error compensating head 2 and the mask 6 is locked by applying brakes.

In step 5, the wedge error compensating head 2 moves away from the mask 6.

In step 6, the wedges 9 are clamped by moving them between the linear actuators 8 and the movable part 4 of the wedge error compensating head 2.

In step 7, the movable part 4 of the wedge error compensating head 2 is drawn by the piston 19 of the means 17 onto the linear actuators 8.

In step 8, the brakes 7 are opened. Thus, the position of the movable part 4 of the wedge error compensating head 2 is determined by the position of the wedges 9.

In step 9, the position of the wedges 9 can be checked and improved.

In step 10, the wedge error is actively fine-compensated for by means of the linear actuators 8. The position of the movable part 4 of the wedge error compensating head 2 measured in step 3 is used as reference position.

Then the device is ready for an imprinting stroke in the Z direction by synchronously controlling the linear actuators 8.

Above, the invention has been explained on the basis of a mask 6 with stationary holder 1 and the substrate 5 being on the movable part 4. Alternatively to the representation in FIGS. 1 to 3, in accordance with the invention the mask 6 can also be arranged on the movable part 4 of the wedge error compensating head 2, wherein in this case the substrate 5 is accordingly fixed to the holder 1.

Moreover, it has been explained above that the wedges 9 can be actively displaced in order to perform the coarse wedge error compensation as exactly as possible. Alternatively, only after measuring the reference position and locking the movable part 4 of the wedge error compensating head 2, the displaceable wedges are moved only once between the linear actuators 8 and a part of the wedge error compensating head. The wedges can already contact the linear actuators 8 and the corresponding part of the wedge error compensating head, but without leading to a change in the position of the involved elements. Alternatively, the wedge is moved only so far that there is no contact between wedge and linear actuator 8 or the corresponding part of the wedge error compensating head. This control displacement of the wedge can be monitored, e.g., by means of a suitable sensor. After the wedge has been positioned, the brakes are released. Because of the positioning of the wedges, the wedge error has already been coarse-compensated for. For the fine wedge error compensation, only a slight control displacement of the linear actuators is necessary.

Alternatively, tensile springs can be used instead of the pressure springs 14. In this case, tensile springs are arranged between the movable part 4 and the stationary part 3. In this case, the movable part 4 and the non-movable part 3 can be moved away from each other by using a hydraulically or pneumatically operating means 17 in that a piston 19, which is fixed to the movable part 4, is moved away from the stationary part 3 by a positive pressure in the means 17 located in the stationary part 3.

The invention claimed is:
1. A device for a controlled relative displacement between a mask or a punch and a substrate in a Z-direction perpendicular to the surface of the substrate with a wedge error compensating head, in particular for imprinting or embossing the substrate and for carrying out an active wedge error compensation, said wedge error compensating head comprising:
- (a) a stationary part and a movable part being movable relative to the stationary part in the Z-direction;
- (b) operating means for moving the stationary part and the moveable part towards each other and apart from each other in the Z-direction;
- (c) at least three linear actuators between the stationary part and the movable part acting in the Z-direction; and
- (d) displaceable wedges provided between the linear actuators and the moveable part or the stationary part, and
- (e) means for controlling the linear actuators, (e1) for actively compensating the wedge error, and (e2) for the controlled relative displacement between the mask or the punch and the substrate.

2. The device according to claim 1, wherein the wedges are integrated in the moveable part or in the stationary part of the wedge error compensating head.

3. The device according to claim 1, wherein the moveable part can be connected with the mask or the substrate.

4. The device according to claim 1, wherein each linear actuator comprises a piezo element.

5. The device according to claim 4, comprising a pneumatic or hydraulic means for moving wedges.

6. The device according to claim 4, comprising a controller for individually controlling or regulating the movement of the individual wedges.

7. The device according to claim 4, comprising at least three measuring probes or at least three sensors for measuring the position of the moveable part of the wedge compensating head.

8. The device according to claim 4, comprising a plurality of brakes for locking the position of the moveable part of the wedge compensating head.

9. A device for controlled relative displacement between a mask or a punch and a substrate in a direction perpendicular to the surface of the substrate, having:
- a stationary part,
- a movable part having a surface for receiving one of a substrate, a mask and a punch, said movable part being movable with respect to said stationary part in a direction perpendicular with respect to said receiving surface,
- operating means arranged operatively between said stationary part and said moveable part and adapted for moving said moveable part towards said stationary part,
- linear actuators arranged operatively between said stationary part and said moveable part and adapted for controlling the relative displacement between the substrate and said mask or punch,
- displaceable wedges provided between said linear actuators and said movable part or said stationary part.

10. The device of claim 9, further comprising a plurality of brakes for temporarily locking a position of said moveable part with respect to said stationary part.

11. The device of claim 9, further comprising a lifting means for lifting the combination of said stationary part and said moveable part in a direction which is perpendicular with respect to said receiving surface.

12. A device for controlled relative displacement between a mask or a punch and a substrate in a direction perpendicular to the surface of the substrate, having:
- a stationary part,
- a movable part having a surface for receiving one of a substrate, a mask and a punch, said movable part being movable with respect to said stationary part in a direction perpendicular with respect to said receiving surface,
- a plurality of linear actuators comprising piezo elements, said linear actuators being arranged operatively between said stationary part and said moveable part and adapted for controlling the relative displacement between the substrate and said mask or punch,
- displaceable wedges provided between said linear actuators and said movable part or said stationary part,
- a plurality of brakes configured to temporarily lock a position of said moveable part with respect to said stationary part.

13. The device of claim 12, further comprising operating means arranged operatively between said stationary part and said moveable part and adapted for moving said moveable part towards said stationary part.

14. The device of claim 13, further comprising a lifting means for lifting the combination of said stationary part and said moveable part in a direction which is perpendicular with respect to said receiving surface.

* * * * *